United States Patent
Inbe

(10) Patent No.: US 6,774,450 B2
(45) Date of Patent: Aug. 10, 2004

(54) SEMICONDUCTOR DEVICE WITH THERMOELECTRIC HEAT DISSIPATING ELEMENT

(75) Inventor: Takashi Inbe, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/225,148

(22) Filed: Aug. 22, 2002

(65) Prior Publication Data

US 2003/0057511 A1 Mar. 27, 2003

(30) Foreign Application Priority Data

Sep. 27, 2001 (JP) ..................................... 2001-297182

(51) Int. Cl.$^7$ ....................... H01L 31/058; H01L 35/34; H01L 37/00
(52) U.S. Cl. ..................... 257/467; 257/713; 136/201
(58) Field of Search .............................. 257/467, 713; 136/201

(56) References Cited

U.S. PATENT DOCUMENTS

| | | | | |
|---|---|---|---|---|
| 6,034,408 A | * | 3/2000 | Ghoshal | 257/467 |
| 6,082,115 A | * | 7/2000 | Strnad | 62/3.7 |
| 6,222,113 B1 | * | 4/2001 | Ghoshal | 136/201 |
| 6,476,483 B1 | * | 11/2002 | Adler et al. | 257/713 |
| 6,476,508 B1 | * | 11/2002 | Strnad | 257/467 |

FOREIGN PATENT DOCUMENTS

| | | |
|---|---|---|
| JP | 61-119067 | 6/1986 |
| JP | 61-174749 | 8/1986 |
| JP | 63-76463 | 4/1988 |
| JP | 5-235127 | 9/1993 |
| JP | 7-240538 | 9/1995 |
| JP | 9-64255 | 3/1997 |
| JP | 11-224922 | 8/1999 |

* cited by examiner

Primary Examiner—Long Pham
Assistant Examiner—Howard Weiss
(74) Attorney, Agent, or Firm—McDermott Will & Emery LLP

(57) ABSTRACT

A thermoelectric converting element is constituted of an N-type semiconductor region, a P-type semiconductor region and metal interconnections. The N-type semiconductor region is formed simultaneously with an $n^{31}$ impurity region and an $n^+$ impurity region of a transistor in an element forming region. The P-type semiconductor region is formed simultaneously with a $p^-$ impurity region and a $p^+$ impurity region of another transistor. In addition, the interconnections in the thermoelectric converting element are formed simultaneously with a metal interconnection connected to the transistor. Thus, a semiconductor device can be obtained, in which cooling effect can be readily achieved without increasing production cost.

6 Claims, 11 Drawing Sheets

SEMICONDUCTOR DEVICE WITH THERMOELECTRIC HEAT DISSIPATING ELEMENT

BACKGROUND OF THE INVENTION

1. Field of the Invention

The present invention relates to a semiconductor device, and in particular, to a semiconductor device in which temperature increase in operation is suppressed.

2. Description of the Background Art

Recently, a semiconductor device of high performance has been demanded to meet various needs. Accordingly, an effort is being made to manufacture a semiconductor device of smaller size, higher density and higher integration. As the size of the semiconductor device is made smaller, an amount of heat produced from the same in operation has increased.

When the amount of produced heat increases and a temperature of the semiconductor device is raised, the semiconductor device would fail to perform a desired operation. Therefore, the semiconductor device is provided with a measure to dissipate heat or control temperature. Typically, for example, a heat radiating fin is attached, or a cooling fan is provided to the semiconductor device, to forcibly cool the same.

A conventional semiconductor device, however, has had a disadvantage as described below. As mentioned above, though cooling of the semiconductor device has been achieved by attaching a heat radiating fin and providing a cooling fan, it is becoming difficult to obtain sufficient cooling effect as the semiconductor device is made smaller. In addition, since the heat radiating fin and the cooling fan are additional members, providing the same has caused an increase of production cost.

SUMMARY OF THE INVENTION

The present invention was made to solve the above-mentioned problems. An object thereof is to provide a semiconductor device in which cooling effect can readily be obtained without increasing production cost.

A semiconductor device according to an aspect of the present invention has a prescribed element, a conductive region and a thermoelectric converting element. The prescribed element is formed in a prescribed region on a main surface of a semiconductor substrate, and includes an impurity region of a first conductivity type and an impurity region of a second conductivity type. The conductive region is electrically connected to the prescribed element. The thermoelectric converting element is formed on the main surface of the semiconductor substrate, has one end side arranged in the vicinity of the prescribed region to absorb heat produced in operation of the prescribed element, and has the other end side arranged in a region producing smaller amount of heat among regions of the semiconductor substrate. The thermoelectric converting element includes a semiconductor region of the first conductivity type and a semiconductor region of the second conductivity type, a first interconnection portion, a second interconnection portion and a third interconnection portion. The semiconductor region of the first conductivity type and the semiconductor region of the second conductivity type are respectively formed on the main surface of the semiconductor substrate, extending from the vicinity of the prescribed region to the region producing smaller amount of heat. The first interconnection portion is electrically connected to the semiconductor region of the first conductivity type and the semiconductor region of the second conductivity type on the one end side. The second interconnection portion is electrically connected to the semiconductor region of the first conductivity type on the other end side. The third interconnection portion is electrically connected to the semiconductor region of the second conductivity type on the other end side.

With such a configuration, heat produced in the prescribed element in operation will be absorbed by the thermoelectric converting element formed on the main surface of the semiconductor substrate and having the semiconductor region of the first conductivity type, the semiconductor region of the second conductivity type and the first to third interconnection portions. Thus, the semiconductor device can be easily cooled without externally providing additional cooling members such as a fin or a fan, as in a conventional semiconductor device. In addition, this thermoelectric converting element can be formed, without additional new steps, simultaneously with the prescribed element. Thus, a semiconductor device with high cooling effect can readily be obtained without increasing manufacturing cost.

Specifically in the thermoelectric converting element, preferably, the semiconductor region of the first conductivity type is formed simultaneously with the impurity region of the first conductivity type; the semiconductor region of the second conductivity type is formed simultaneously with the impurity region of the second conductivity type; and the first interconnection portion, the second interconnection portion and the third interconnection portion are formed simultaneously with the conductive region.

In addition, with respect to the thermoelectric converting element, a power supply portion is preferably provided for providing a direct current from the second interconnection portion through the semiconductor region of the first conductivity type, the first interconnection portion and the semiconductor region of the second conductivity type toward the third interconnection portion.

Thus, heat produced in the prescribed region having the prescribed element formed therein will be dissipated by the thermoelectric converting element to the region producing smaller amount of heat, and cooling of a heat producing portion in a semiconductor device is achieved.

Moreover, an electromotive force measuring portion connected to the other end side of the thermoelectric converting element, and a temperature control portion connected to the power supply portion and controlling heat absorption by the thermoelectric converting element by adjusting a current provided to the thermoelectric converting element based on the electromotive force detected by the electromotive force measuring portion are preferably provided.

Thus, the current provided to the thermoelectric converting element is adjusted in accordance with a temperature in the prescribed region, and more appropriate and efficient cooling can be achieved.

Meanwhile, the electromotive force produced in the thermoelectric converting element by absorbing the heat is preferably used for driving other elements formed on the semiconductor substrate.

In this case, heat produced in the prescribed region is converted to thermal electromotive force, to suppress temperature increase therein, and the heat producing portion in the semiconductor device is cooled. In addition, using the electromotive force for driving other element can save power consumption.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
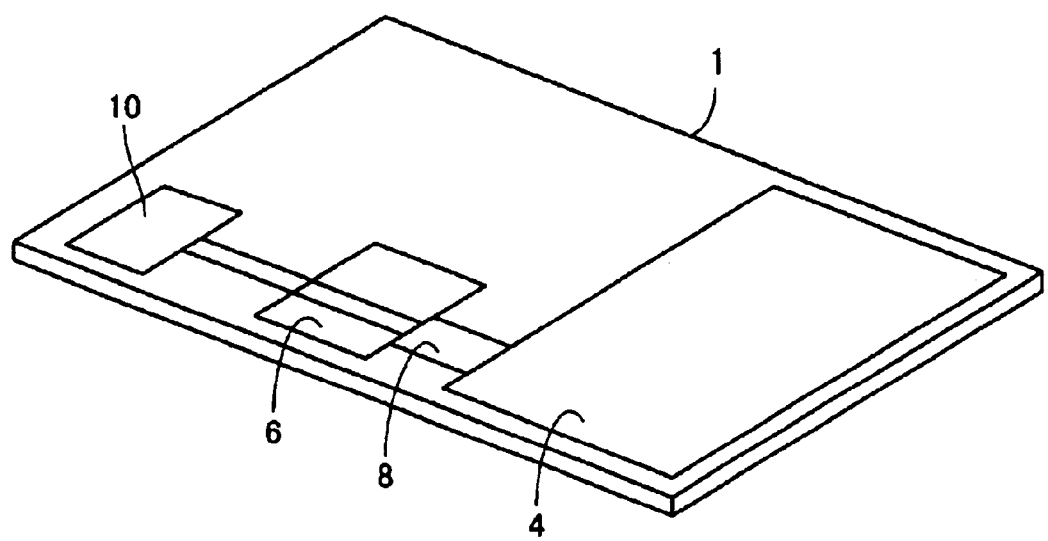
FIG. 1 is a perspective view of a semiconductor device according to a first embodiment of the present invention.

A semiconductor device according to a first embodiment of the present invention will be described. As shown in FIG. 1, on a surface of a semiconductor substrate (a semiconductor chip) 1, a semiconductor element is formed, and an element forming region 4 producing relatively large amount of heat in operation and a region 6 producing relatively small amount of heat are provided. In the semiconductor device, a thermoelectric converting element (a Peltier element) 8 for dissipating heat produced in element forming region 4 to region 6 producing relatively small amount of heat is provided. A power supply portion 10 is also provided for driving thermoelectric converting element 8.

Figure 2:
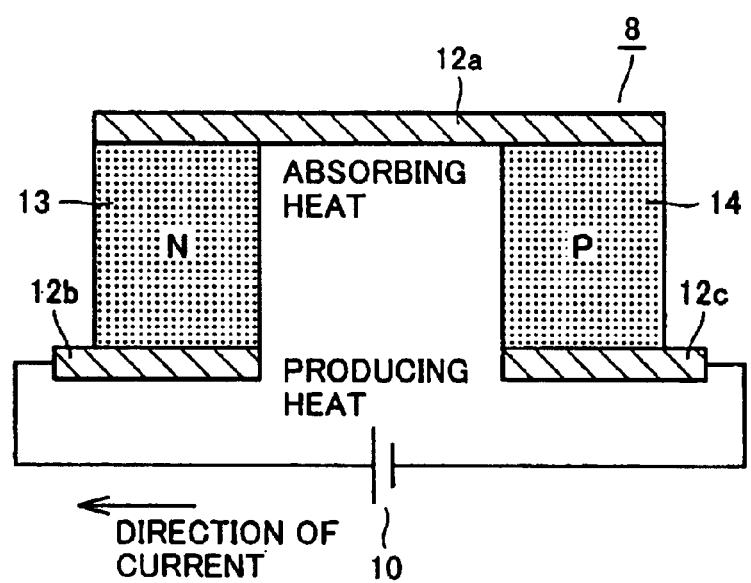
FIG. 2 is a schematic diagram showing a structure of a thermoelectric converting element in the first embodiment.

A basic configuration of such thermoelectric converting element 8 will next be described. First, as shown in FIG. 2, in thermoelectric converting element 8, an N-type semiconductor region 13 and a P-type semiconductor region 14 are respectively formed extending from element forming region 4 to region 6 producing relatively small amount of heat. A metal interconnection 12a is electrically connected to a portion of N-type semiconductor region 13 and a portion of P-type semiconductor region 14 respectively positioned in the vicinity of element forming region 4.

Meanwhile, a metal interconnection 12b is electrically connected to a portion of N-type semiconductor region 13 positioned in the vicinity of region 6 producing relatively small amount of heat, and a metal interconnection 12c is electrically connected to a portion of P-type semiconductor region 14. Power supply portion 10 is a direct current power supply, having a positive electrode side connected to metal interconnection 12b and a negative electrode side connected to metal interconnection 12c.

Therefore, as indicated by an arrow, current flows from metal interconnection 12b through N-type semiconductor region 13, metal interconnection 12a and P-type semiconductor region 14 toward metal interconnection 12c.

Here, due to Peltier effect, a joint portion of N-type semiconductor region 13 with metal interconnection 12a and a joint portion of P-type semiconductor region 14 with metal interconnection 12a become a heat absorbing side, to absorb heat. On the other hand, a joint portion of N-type semiconductor region 13 with metal interconnection 12b and a joint portion of P-type semiconductor region 14 with metal interconnection 12c become a heat producing side, to dissipate heat.

In the semiconductor device, the heat absorbing side of thermoelectric converting element 8 is arranged in the vicinity of element forming region 4 producing relatively large amount of heat, and the heat producing side is arranged in the vicinity of element forming region 6 producing relatively small amount of heat. Accordingly, heat produced in element forming region 4 is absorbed in thermoelectric converting element 8, to be dissipated in region 6 producing relatively small amount of heat, and thus cooling of heat producing portion in the semiconductor device is achieved. Here, a distance between the heat absorbing side and element forming region 4 is preferably approximately several $\mu$m to several tens of $\mu$m.

Figure 3:
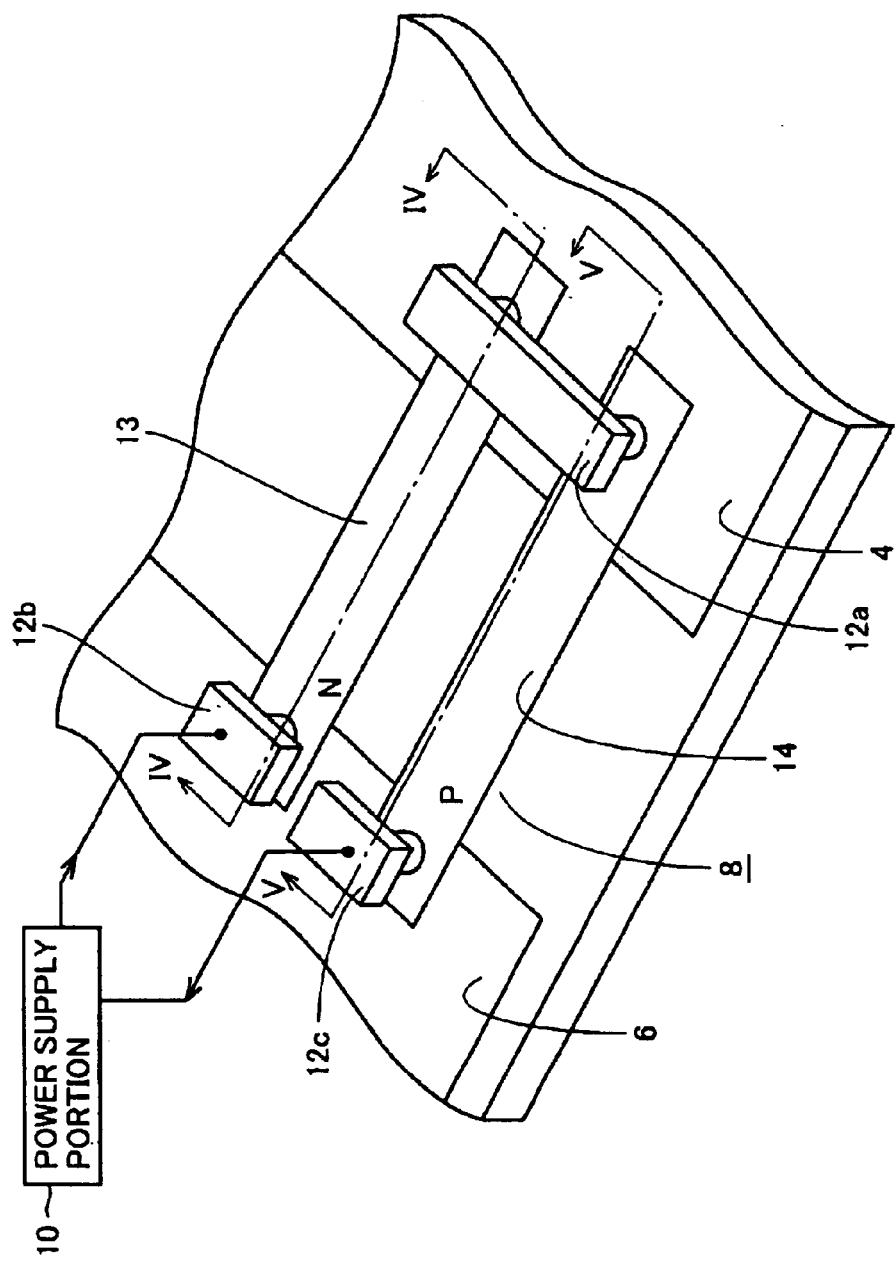
FIG. 3 is a partially enlarged perspective view showing a portion of the semiconductor device shown in FIG. 1, in the first embodiment.

An example of a specific structure of thermoelectric converting element 8 will now be described. As shown in FIG. 3, on the surface of semiconductor substrate 1, N-type semiconductor region 13 and P-type semiconductor region 14 are respectively formed, extending from element forming region 4 to region 6 producing relatively small amount of heat. In the vicinity of element forming region 4, metal interconnection 12a electrically connected to both N-type semiconductor region 13 and P-type semiconductor region 14 is formed.

In the vicinity of region 6 producing relatively small amount of heat, metal interconnection 12b electrically connected only to N-type semiconductor region 13 is formed, and metal interconnection 12c electrically connected only to P-type semiconductor region 14 is formed.

Figure 4:
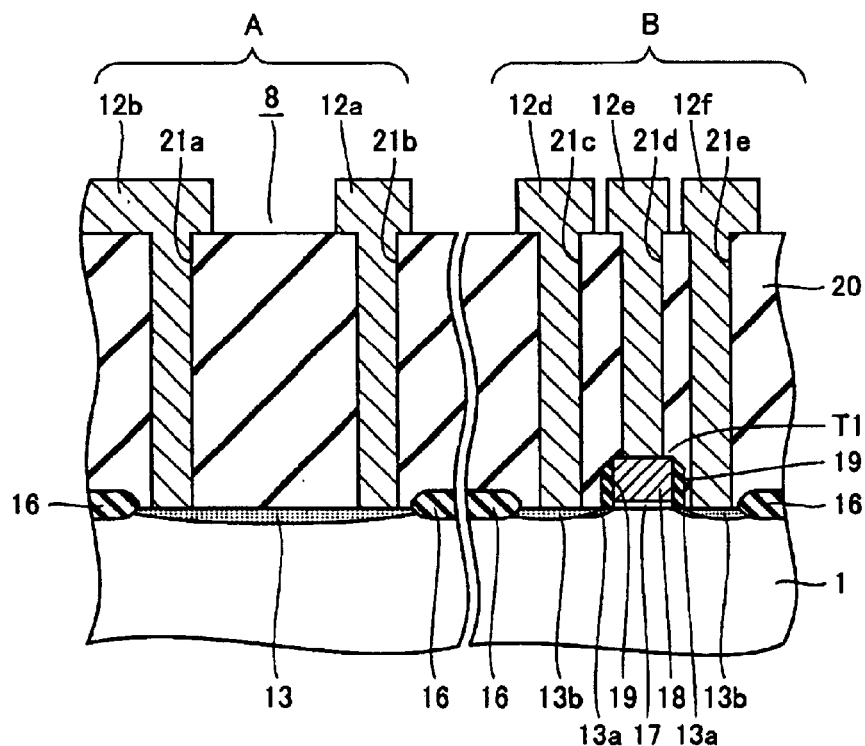
FIG. 4 is a cross-sectional view along the line IV—IV shown in FIG. 3, in the first embodiment.

A cross-sectional structure of thermoelectric converting element 8 including a portion of element forming region 4, will also be described. First, in a portion of N-type semiconductor region 13 (a region A) in thermoelectric converting element 8 and in a portion of element forming region 4 (a region B) (a line IV—IV), a prescribed element isolation film 16 is formed on the surface of semiconductor substrate 1, as shown in FIG. 4.

In region A, N-type semiconductor region 13 is formed on the semiconductor substrate 1, on which an interlayer insulating film 20 is formed. In a portion of interlayer insulating film 20 positioned in the vicinity of element forming region 4, a contact hole 21b exposing the surface of N-type semiconductor region 13 is formed. In a portion of interlayer insulating film 20 positioned in the vicinity of region 6 producing relatively small amount of heat, a contact hole 21a exposing the surface of N-type semiconductor region 13 is formed.

Metal interconnections 12b, 12a made, for example, of aluminum are respectively formed on interlayer insulating film 20 so as to bury contact holes 21a, 21b.

Meanwhile, in region B, a gate electrode 18 is formed on semiconductor substrate 1, with a gate insulating film 17 interposed. N⁻ impurity regions 13a and n⁺ impurity regions 13b are formed on the surface of the semiconductor substrate positioned respectively on one side surface side and the other side surface side of gate electrode 18, with gate electrode 18 lying therebetween. On both side surfaces of gate electrode 18, sidewall insulating films 19 are respectively formed.

An n-channel type MOS transistor T1 is constituted with gate electrode 18 and respective pairs of n⁻ impurity regions 13a and n⁺ impurity regions 13b. Interlayer insulating film 20 is formed so as to cover transistor T1.

In interlayer insulating film 20, contact holes 21c, 21e exposing the surface of n⁺ impurity regions 13b are formed, and a contact hole 21d exposing the surface of gate electrode 18 is formed.

Metal interconnections 12d–12f made, for example, of aluminum are respectively formed on interlayer insulating film 20 so as to bury contact holes 21c–21e. In FIG. 3, transistor T1 in particular is not shown in element forming region 4 for the sake of simplicity.

Here, N-type semiconductor region 13 in thermoelectric converting element 8 is formed simultaneously with n⁻ impurity regions 13a and n⁺ impurity regions 13b of transistor T1. In addition, metal interconnections 12b, 12a in thermoelectric converting element 8 are formed simultaneously with metal interconnections 12d–12e electrically connected to transistor T1.

Figure 5:
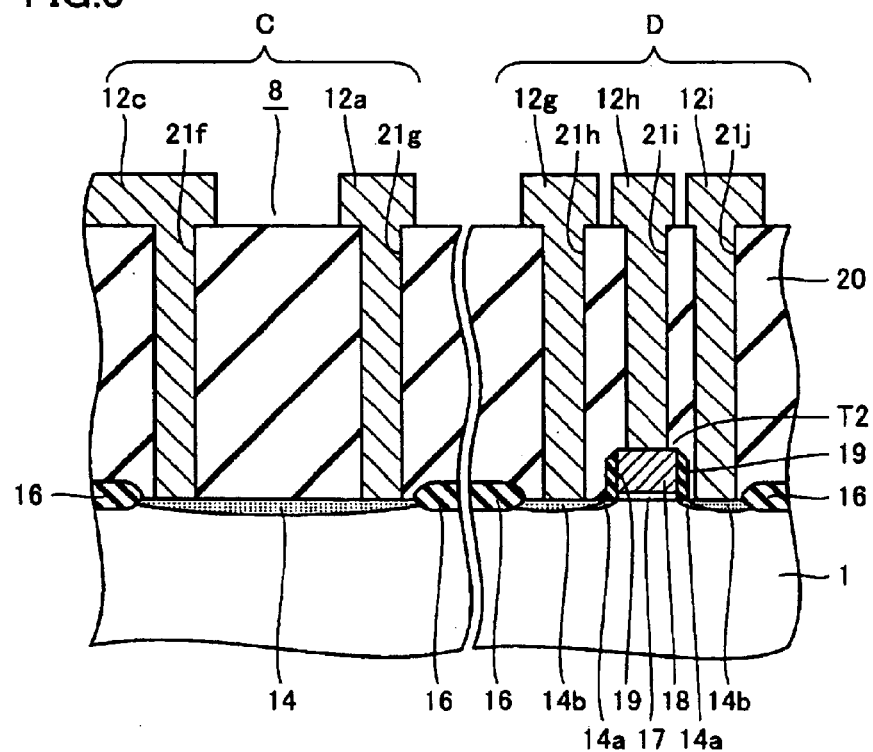
FIG. 5 is a cross-sectional view along the line V—V shown in FIG. 3, in the first embodiment.

Next, as shown in FIG. 5, in a portion of P-type semiconductor region 14 (a region C) in thermoelectric converting element 8 and in a portion of element forming region 4 (a region D) (line V—V), in region C, P-type semiconductor region 14 is formed on the surface of semiconductor substrate 1, on which interlayer insulating film 20 is formed. In a portion of interlayer insulating film 20 positioned in the vicinity of element forming region 4, a contact hole 21g exposing the surface of P-type semiconductor region 14 is formed. In a portion of interlayer insulating film 20 positioned in the vicinity of region 6 producing relatively small amount of heat, a contact hole 21f exposing the surface of P-type semiconductor region 14 is formed.

Metal interconnections 12c, 12a made, for example, of aluminum are respectively formed on interlayer insulating film 20 so as to bury contact holes 21f, 21g.

Meanwhile, in region D, gate electrode 18 is formed on semiconductor substrate 1, with gate insulating film 17 interposed. P⁻ impurity regions 14a and p⁺ impurity regions 14b are formed on the surface of the semiconductor substrate positioned respectively on one side surface side and the other side surface side of gate electrode 18, with gate electrode 18 lying therebetween. On both side surfaces of gate electrode 18, sidewall insulating films 19 are respectively formed.

A p-channel type MOS transistor T2 is constituted with gate electrode 18 and respective pairs of p⁻ impurity regions 14a and p⁺ impurity regions 14b. Interlayer insulating film 20 is formed so as to cover transistor T2.

In interlayer insulating film 20, contact holes 21h, 21j exposing the surface of p⁺ impurity regions 14b are formed, and a contact hole 21i exposing the surface of gate electrode 18 is formed.

Metal interconnections 12g–12i made, for example, of aluminum are respectively formed on interlayer insulating film 20 so as to bury contact holes 21h–21j. In FIG. 3, transistor T2 in particular is not shown in element forming region 4 for the sake of simplicity.

Here, P-type semiconductor region 14 in thermoelectric converting element 8 is formed simultaneously with p⁻ impurity regions 14a and p⁺ impurity regions 14b of transistor T2. In addition, metal interconnections 12c, 12a in thermoelectric converting element 8 are formed simultaneously with metal interconnections 12g–12i electrically connected to transistor T2. Metal interconnections 12g–12i are formed simultaneously with metal interconnections 12d–12e electrically connected to transistor T1.

A manufacturing method of the semiconductor device described above is as follows. Since an only difference between the cross-sectional structures shown in FIGS. 4 and 5 is a conductivity type of impurity regions as described above, the manufacturing method related to the cross-sectional structure in FIG. 4 will be discussed, not repeating for FIG. 5.

Figure 6:
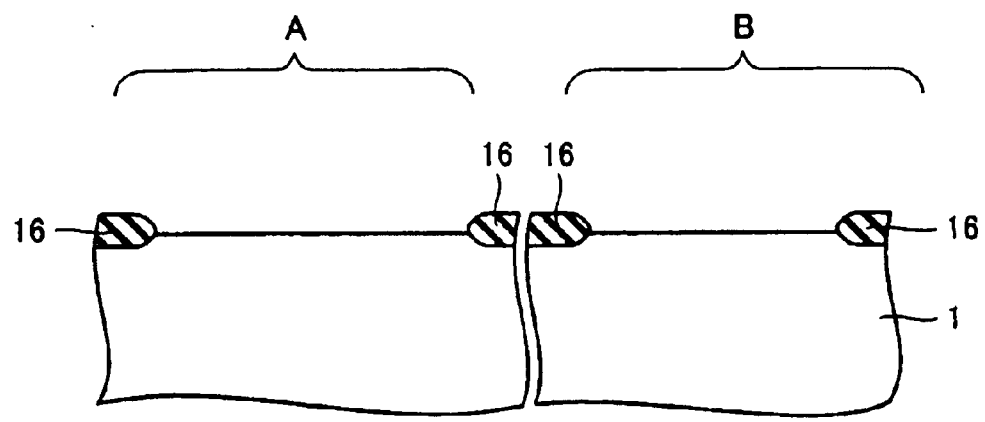
FIG. 6 is a cross-sectional view showing a step of a method of manufacturing the semiconductor device, in the first embodiment.
Figure 7:
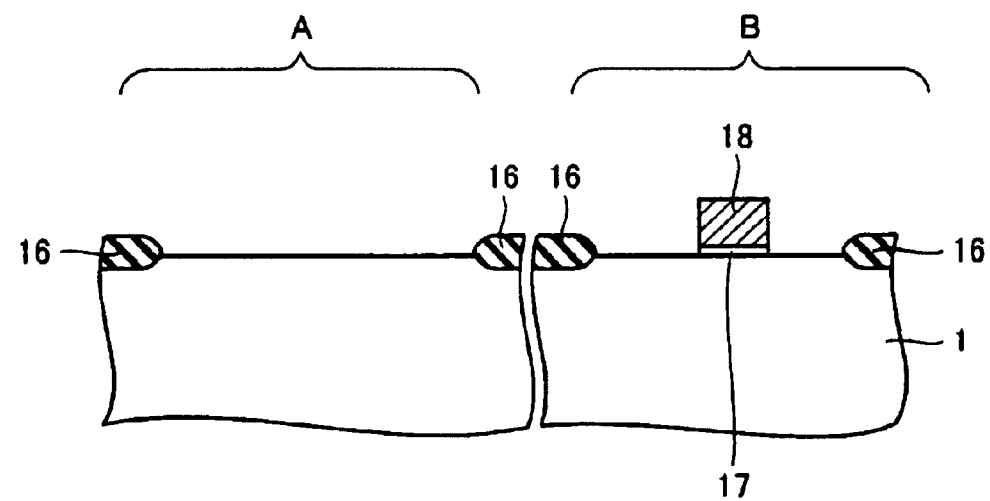
FIG. 7 is a cross-sectional view showing a step performed after the step shown in FIG. 6, in the first embodiment.
Figure 8:
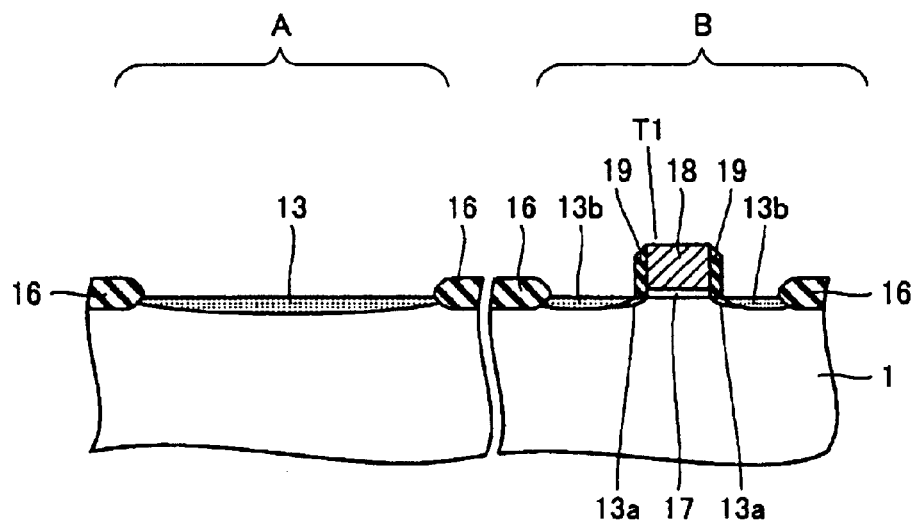
FIG. 8 is a cross-sectional view showing a step performed after the step shown in FIG. 7, in the first embodiment.

First, as shown in FIG. 6, a prescribed element isolation film 16 for providing an element forming region is formed on a main surface of a semiconductor substrate 1. Next, as shown in FIG. 7, a gate electrode 18 is formed on the surface of semiconductor substrate 1, positioned in region B, with a gate insulating film 17 interposed. Thereafter, as shown in FIG. 8, using gate electrode 17 as a mask, an n-type impurity is injected to form an n⁻ impurity region 13a.

Simultaneously, in region A, the n-type impurity is injected also to a region to be an N-type semiconductor region in a thermoelectric converting element. Thereafter, sidewall insulating films 19 are formed on both side surfaces of gate electrode 18. Using those sidewall insulating films and gate electrode 18 as a mask, the n-type impurity is injected to form an n⁺ impurity region 13b.

Simultaneously, in region A, the n-type impurity is injected also to a region to be the N-type semiconductor region in the thermoelectric converting element. Thus, in region B, an n-channel type MOS transistor T1 including gate electrode 18, n⁻ impurity region 13a and n⁺ impurity region 13b is formed.

Meanwhile, in region A, N-type semiconductor region 13 in the thermoelectric converting element is formed. A P-type semiconductor region in the thermoelectric converting element is formed simultaneously with p⁻ impurity region 14a and p⁺ impurity region 14b in a p-channel type MOS transistor in a similar manner.

Figure 9:
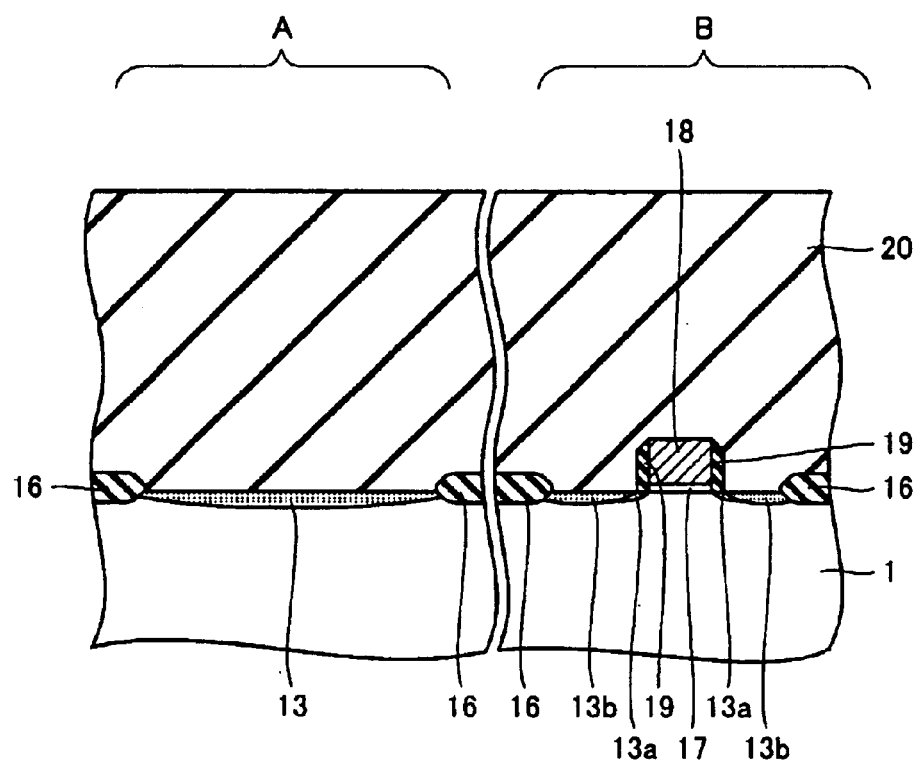
FIG. 9 is a cross-sectional view showing a step performed after the step shown in FIG. 8, in the first embodiment.
Figure 10:
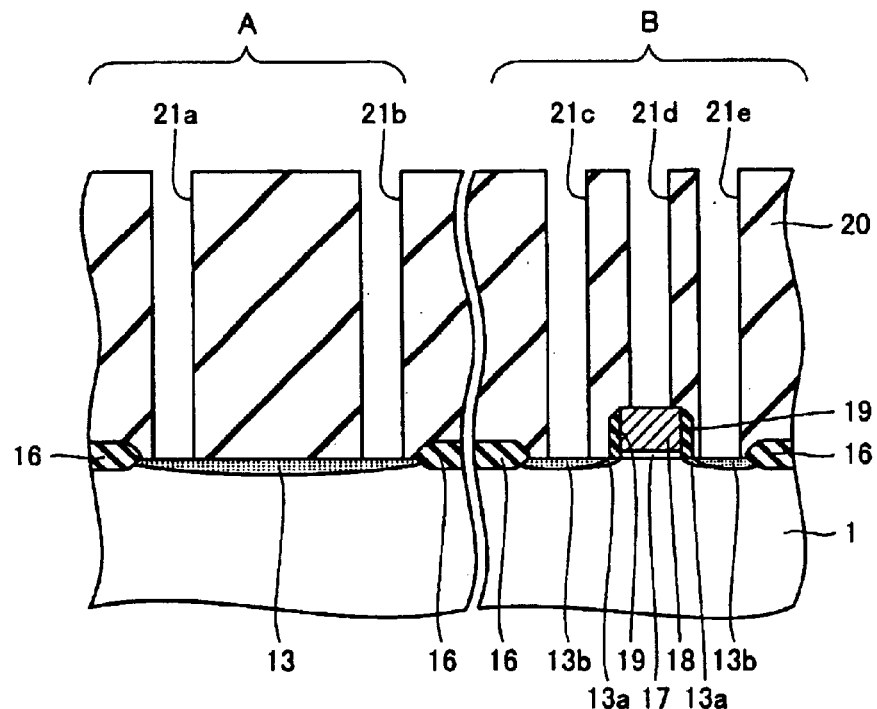
FIG. 10 is a cross-sectional view showing a step performed after the step shown in FIG. 9, in the first embodiment.

Next, as shown in FIG. 9, an interlayer insulating film 20 such as a silicon oxide film is formed so as to cover gate electrode 18. As shown in FIG. 10, using a prescribed photoresist (not shown) formed on interlayer insulating film 20 as a mask, interlayer insulating film 20 is anisotropically etched, to form contact holes 21c, 21e exposing the surface of n⁺ impurity regions 13b and a contact hole 21d exposing the surface of gate electrode 18 respectively in region B.

In region A, a contact hole 21a is formed, exposing a portion of N-type semiconductor region 13, in a portion of interlayer insulating film 20 positioned in the vicinity of region 6 producing relatively small amount of heat, and a contact hole 21b is formed, exposing a portion of N-type semiconductor region 13 in a portion of interlayer insulating film 20 positioned in the vicinity of element forming region 4.

Figure 11:
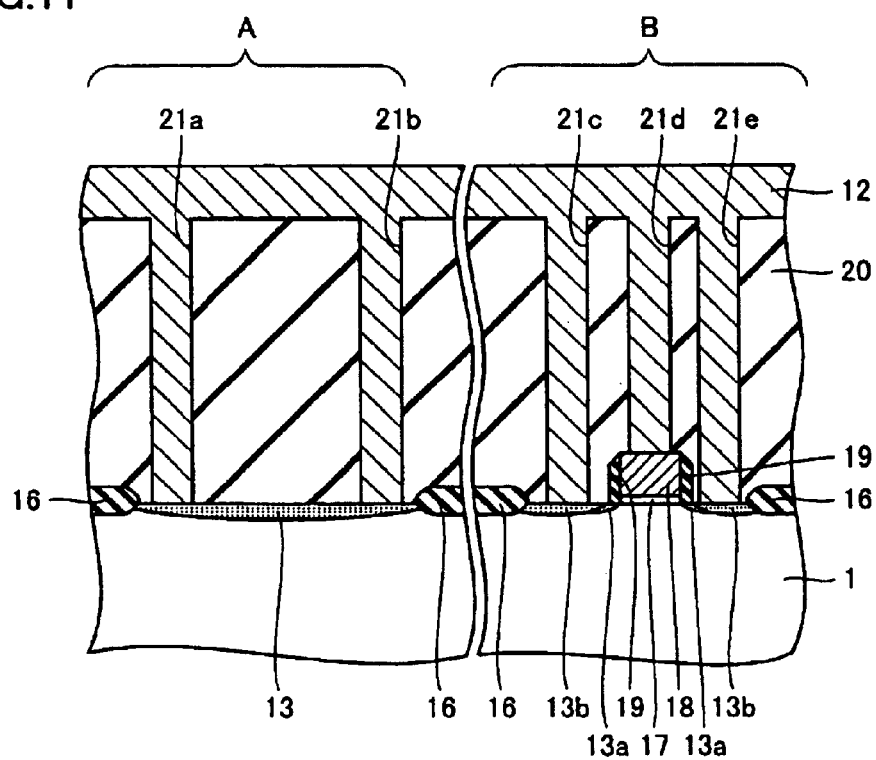
FIG. 11 is a cross-sectional view showing a step performed after the step shown in FIG. 10, in the first embodiment.

Next, as shown in FIG. 11, a metal film 12 made, for example, of aluminum is formed on interlayer insulating film 20 so as to bury contact holes 21a–21e. On metal film 12, a prescribed photoresist pattern (not shown) is formed. Using the photoresist pattern as a mask, metal film 12 is anisotropically etched to form prescribed metal interconnections 12a–12e, as shown in FIG. 4. Thus, a main portion of a semiconductor device having thermoelectric converting element 8 is completed.

As described above, in the semiconductor device, thermoelectric converting element 8 includes N-type semiconductor region 13, P-type semiconductor region 14 and metal interconnections 12a–12c. N-type semiconductor region 13 is formed simultaneously with $n^-$ impurity region 13a and $n^+$ impurity region 13b of n-channel type MOS transistor T1 in element forming region 4.

In addition, P-type semiconductor region 14 is formed simultaneously with $p^-$ impurity region 14a and $p^+$ impurity region 14b of p-channel type MOS transistor T2 in element forming region 4.

Metal interconnections 12a–12c are formed simultaneously with metal interconnections 12d–12i electrically connected to n-channel type MOS transistor T1 and p-channel type MOS transistor T2.

Thus, thermoelectric converting element 8 is formed simultaneously with MOS transistors T1, T2 in element forming region 4, without adding new steps. As a result, a semiconductor device with high cooling effect can be manufactured without increasing manufacturing cost.

In addition, compared with a conventional semiconductor device, additional members such as a fin or a fan need not be provided. Therefore, the present invention can contribute to implement a semiconductor device of higher integration and higher density as well as electric appliances of smaller size incorporating such a semiconductor device.

Figure 12:
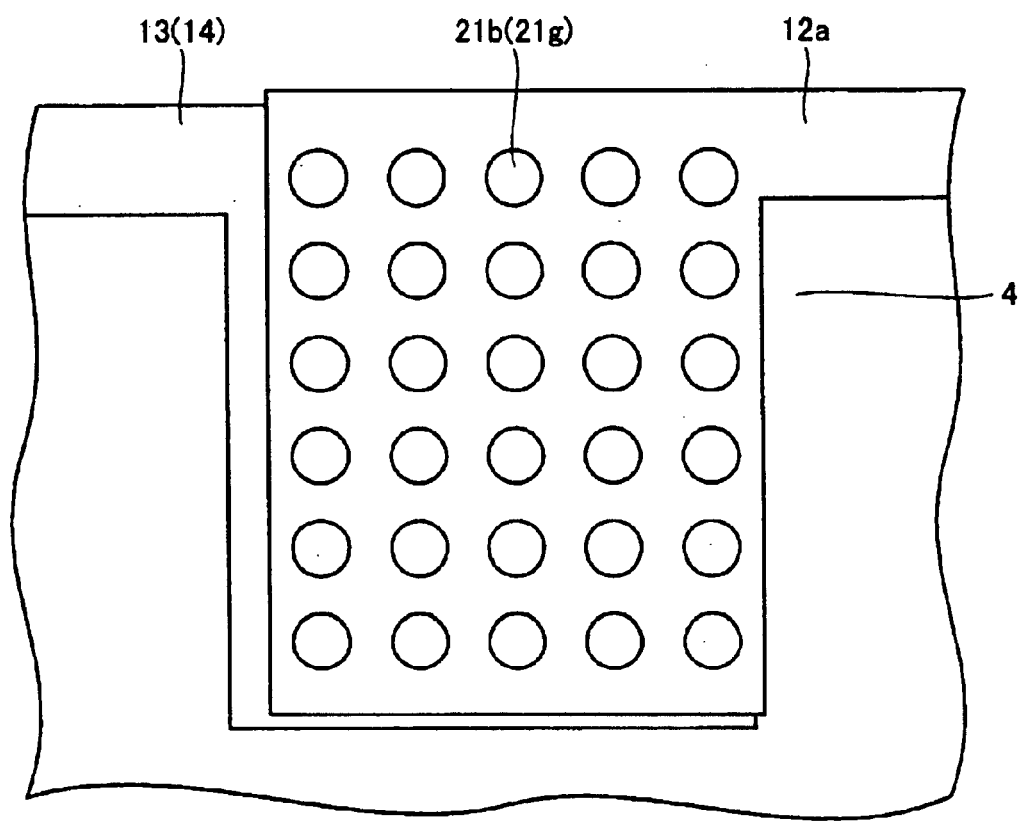
FIG. 12 is a top view showing one example of an arrangement of contact holes on element forming region side, in the first embodiment.

Here, as shown in FIG. 12, contact holes 21b, 21g formed in a portion of interlayer insulating film 20 positioned at least in the vicinity of element forming region 6 are provided in a plurality of numbers respectively. Accordingly, contact surface area of metal interconnection 12a with N-type semiconductor region 13 and P-type semiconductor region is enlarged, to allow effective absorption of heat produced in element forming region 4. Such a plurality of contact holes can be provided in the vicinity of the region producing relatively small amount of heat, to dissipate heat efficiently.

Figure 13:
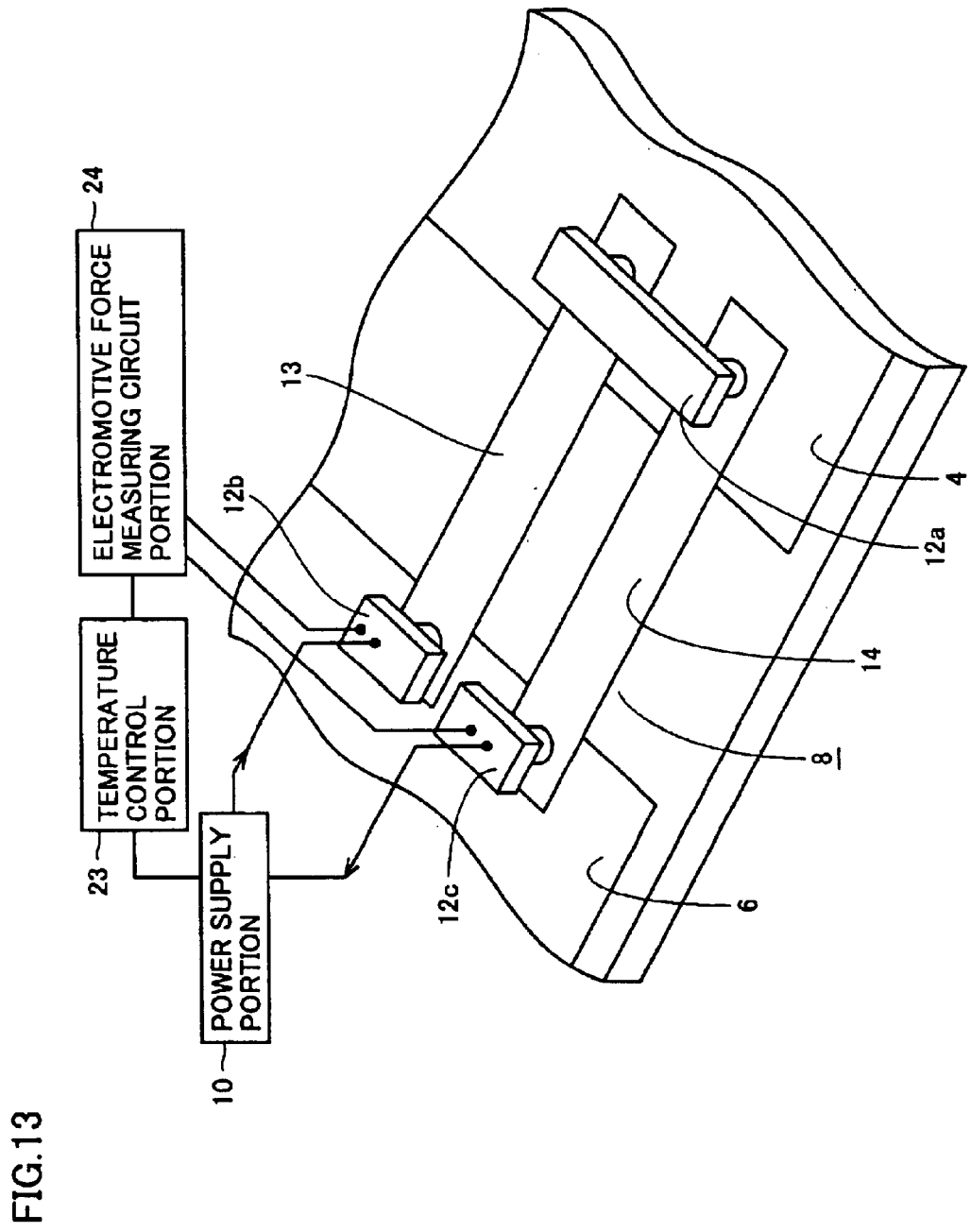
FIG. 13 is a partially enlarged perspective view showing a portion of a semiconductor device according to a variation, in the first embodiment.

A semiconductor device according to a variation will now be described. As shown in FIG. 13, a semiconductor device according to a variation is provided with an electromotive force measuring circuit portion 24 measuring an electromotive force produced in a thermoelectric converting element 8. A temperature control portion 23 is provided, controlling heat absorption and dissipation by thermoelectric converting element 8 by adjusting current provided to thermoelectric converting element 8 based on the electromotive force detected by electromotive force measuring circuit portion 24.

Figure 14:
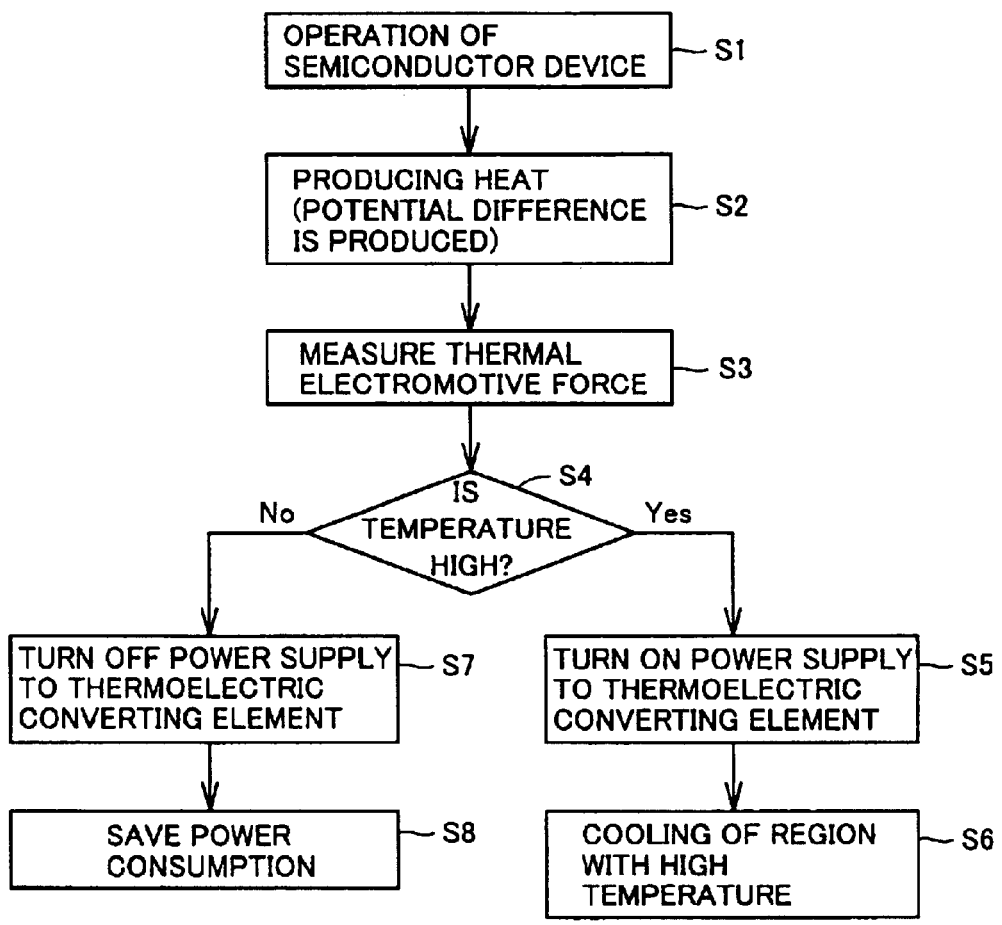
FIG. 14 shows a flow of an operation of the semiconductor device according to the variation, in the first embodiment.

An operation of the semiconductor device will now be described. As shown in FIG. 14, in an element forming region 4 having semiconductor elements T1, T2 formed therein, heat is produced (S2) through an operation of the semiconductor device (S1). Because of the produced heat, thermal electromotive force is created between a metal interconnection 12b and a metal interconnection 12c positioned in the vicinity of a region 6 producing relatively small amount of heat. Electromotive force measuring circuit portion 24 measures the thermal electromotive force, to find temperature difference between element forming region 4 and region 6 producing relatively small amount of heat (S3).

Temperature control portion 23 determines whether the temperature difference is larger or smaller than a prescribed temperature difference. If the temperature difference is determined to be larger than the prescribed temperature difference, an instruction to turn on power supply to thermoelectric converting element 8 will be output to power supply portion 10 (S5). Thus, element forming region 4 having the semiconductor element formed therein will be cooled (S6).

On the other hand, if the temperature difference is determined to be smaller than the prescribed temperature difference, an instruction to turn off power supply to thermoelectric converting element 8 will be output to power supply portion 10 (S7). Thus, cooling is not effected by thermoelectric converting element 8, and power consumption will be saved (S8).

As described above, a semiconductor device according to the variation, while saving power consumption, can efficiently cool a heat producing portion therein by turning on or off power supply portion 10 having electromotive force measuring circuit portion 24 and temperature control portion 23, and driving thermoelectric converting element 8 based on the temperature difference.

(Second Embodiment)

In a semiconductor device described in the first embodiment, heat produced in a semiconductor element is absorbed by a thermoelectric converting element, to be dissipated to a region producing relatively small amount of heat, and thus cooling is achieved. In a second embodiment, a semiconductor device will be described, in which heat produced in the semiconductor element is converted to electric energy (thermal electromotive force) by a thermoelectric converting element to suppress temperature increase therein.

Figure 15:
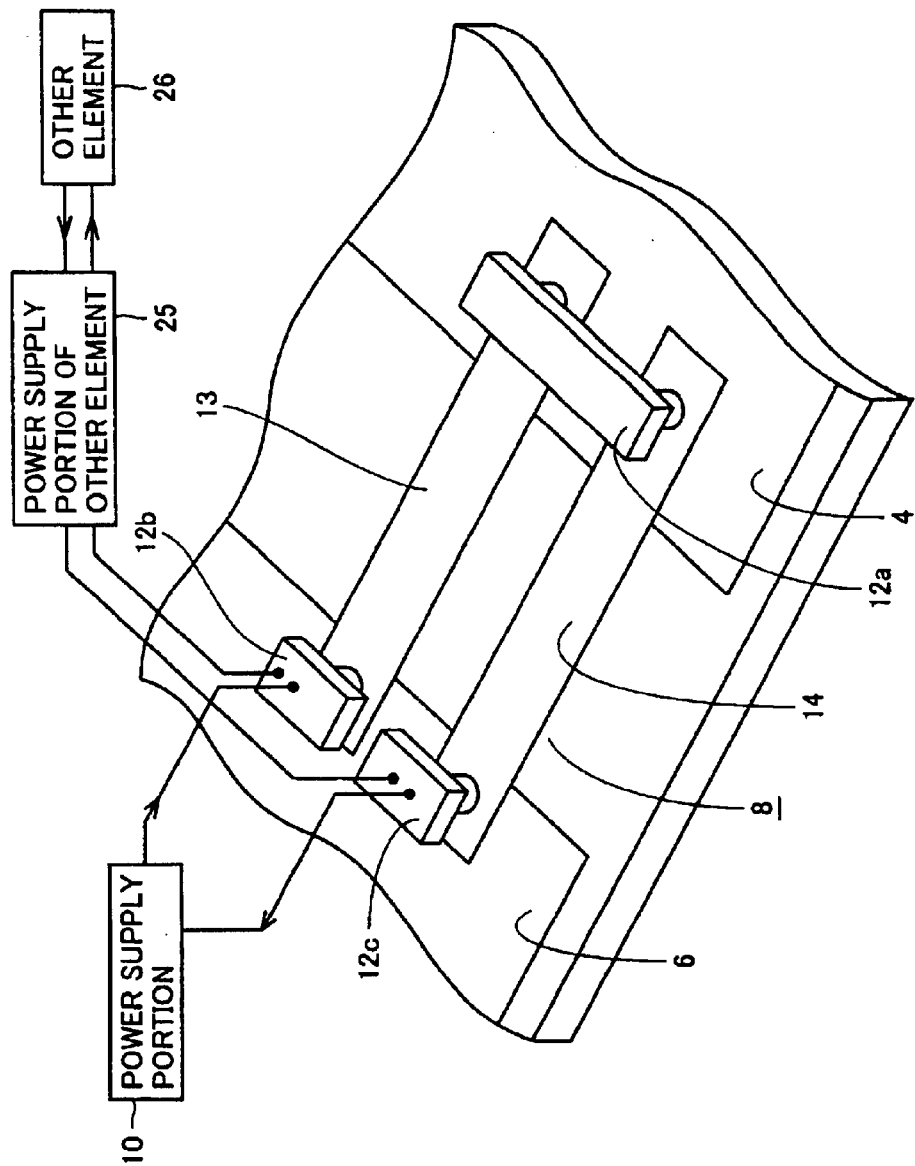
FIG. 15 is a partially enlarged perspective view showing a portion of a semiconductor device according to a second embodiment of the present invention.

A basic configuration of a thermoelectric converting element in the semiconductor device is similar to that of the first embodiment, except for the absence of a power supply portion. Therefore, as shown in FIG. 15, in thermoelectric converting element 8, a metal interconnection 12a is electrically connected to a portion of an N-type semiconductor region 13 and a portion of a P-type semiconductor region 14 respectively positioned in the vicinity of an element forming region 4.

Meanwhile, a metal interconnection 12b is connected to a portion of N-type semiconductor region 13 positioned in the vicinity of a region 6 producing relatively small amount of heat, and a metal interconnection 12c is connected to a portion of P-type semiconductor region 14. Those metal interconnections 12b, 12c are electrically connected to a power supply portion 25 for another element for driving other element 26 formed on the same semiconductor substrate 1.

As described above, the semiconductor device is of a similar configuration as in the first embodiment, except for the absence of the power supply portion. Therefore, the semiconductor device can be formed through substantially the same steps as in the manufacturing method in the first embodiment.

Figure 16:
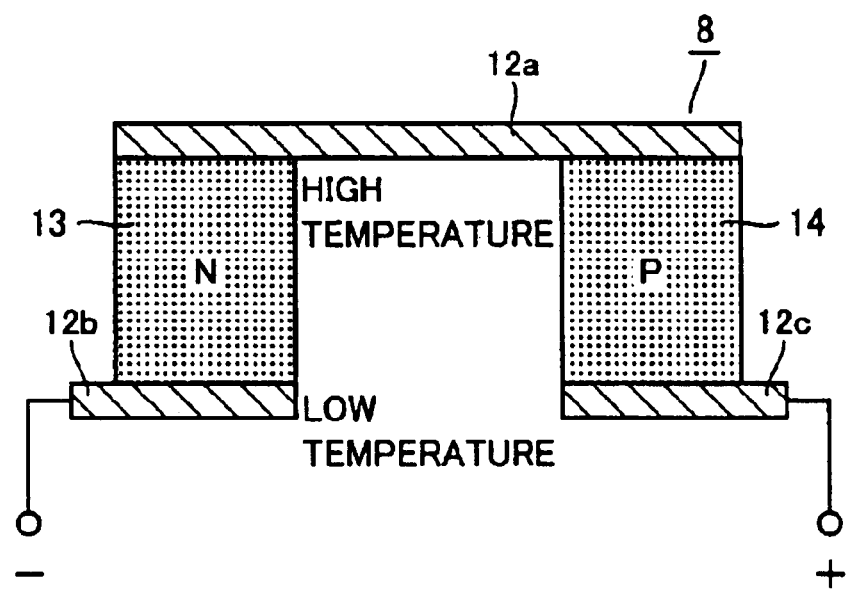
FIG. 16 is a schematic diagram showing a structure of a thermoelectric converting element, in the second embodiment.

According to this semiconductor device, as schematically shown in FIG. 16, a joint portion of metal interconnection 12a with N-type semiconductor region 13 and a joint portion of metal interconnection 12a with P-type semiconductor region 14 (a joint portion A) are arranged in the vicinity of element forming region 4 producing relatively large amount of heat. On the other hand, a joint portion of metal interconnection 12b with N-type semiconductor region 13 and a portion of metal interconnection 12c with P-type semiconductor region 14 (a joint portion B) are arranged in the vicinity of region 6 producing relatively small amount of heat. Accordingly, in operation of the semiconductor device, as temperature of the joint portion A is raised and that of the joint portion B is lowered, thermal electromotive force results between metal interconnection 12b and metal interconnection 12c.

The thermal electromotive force is provided to power supply portion 25 for driving other semiconductor elements formed on semiconductor substrate 1, to be consumed for driving other elements 26.

Therefore, heat produced in element forming region 6 is first converted into thermal electromotive force by thermoelectric converting element 8, and thus temperature increase in element forming region 6 can be suppressed.

In addition, using produced thermal electromotive force for driving other element will save power consumption in the entire semiconductor device.

Furthermore, such thermoelectric converting element 8 can be formed simultaneously with the step of forming MOS transistors T1, T2 in element forming region 6 without any additional new steps. Consequently, a semiconductor device with high cooling effect can be manufactured without increasing manufacturing cost.

Such a MOS transistor tends to readily produce heat due to requirements for smaller size (gate length: from approximately 0.01 $\mu$m to 0.20 $\mu$m) and high-speed operation. The transistor can, however, be effectively cooled by thermoelectric converting element 8.

Though a MOS transistor is provided as an example for an element, a semiconductor device having an element including regions of respective conductivity types, that is, P-type and N-type, and a conductive region connected to such an element, could easily form a thermoelectric converting element simultaneously with such regions of each conductivity type and the conductive region, without adding new steps.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a prescribed element formed in a prescribed region on a main surface of a semiconductor substrate and including an impurity region of a first conductivity type and an impurity region of a second conductivity type;

conductive regions electrically connected to said prescribed element; and a thermoelectric converting element formed on the main surface of said semiconductor substrate, having one end side arranged in the vicinity of said prescribed region to absorb heat produced in operation of said prescribed element and having the other end side arranged in a region producing smaller amount of heat among regions of said semiconductor substrate;

an interlayer insulating film formed on said semiconductor substrate so as to cover said prescribed element and said thermoelectric converting element;

a plurality of first contact holes formed in a portion of said interlayer insulating film positioned on said one end side and exposing a surface of said semiconductor region of the first conductivity type respectively; and a plurality of second contact holes formed in a portion of said interlayer insulating film positioned on said one end side and exposing a surface of said semiconductor region of the second conductivity type respectively; wherein said first interconnection portion is electrically connected to said semiconductor region of the first conductivity type and said semiconductor region of the second conductivity type through said plurality of first contact holes and said plurality of second contact holes; and wherein said thermoelectric converting element includes:

a semiconductor region of a first conductivity type and a semiconductor region of a second conductivity type respectively formed on the main surface of said semiconductor substrate, extending from the vicinity of said prescribed region to said region producing smaller amount of heat, each of the semiconductor region of a first conductivity type and the semiconductor region of a second conductivity type having an impurity density and depth the same as those in the impurity regions of the first and second conductivity types, respectively, in the prescribed element;

a first interconnection portion electrically connected to said semiconductor region of the first conductivity type and said semiconductor region of the second conductivity type on said one end side;

a second interconnection portion electrically connected to said semiconductor region of the first conductivity type on said the other end side;

a third interconnection portion electrically connected to said semiconductor region of the second conductivity type on said the other end side;

the first, second and third interconnection portions in the thermoelectric converting element are formed with a layer the same as a conductive region electrically connected to the element; and the thermoelectric converting element and the prescribed element are formed on the identical substrate; and wherein said prescribed element includes:

a first transistor including a pair of said impurity regions of the first conductivity type and a first electrode portion; and a second transistor including a pair of said impurity regions of the second conductivity type and a second electrode portion.

2. The semiconductor device according to claim 1, wherein in said thermoelectric converting element, said semiconductor region of the first conductivity type is formed simultaneously with said impurity region of the first conductivity type, said semiconductor region of the second conductivity type is formed simultaneously with said impurity region of the second conductivity type, and said first interconnection portion, said second interconnection portion and said third interconnection portion are formed simultaneously with said conductive regions.

3. The semiconductor device according to claim 2, wherein
said prescribed element includes
a first transistor including a pair of said impurity regions of the first conductivity type and a first electrode portion, and
a second transistor including a pair of said impurity regions of the second conductivity type and a second electrode portion.

4. The semiconductor device according to claim 1, further comprising
a power supply portion providing a direct current from said second interconnection portion through said semiconductor region of the first conductivity type, the first interconnection portion and said semiconductor region of the second conductivity type toward said third interconnection portion, with respect to said thermoelectric converting element.

5. The semiconductor device according to her comprising:
an electromotive force measuring portion connected to said the other end side of said thermoelectric converting element; and
a temperature control portion connected to said power supply potion and controlling heat absorption by said thermoelectric converting element by adjusting the current provided to said thermoelectric converting element based on electromotive force detected by said electromotive force measuring portion.

6. The semiconductor device according to claim 1, further comprising:
another element in addition to said prescribed element; and
a power supply portion for driving said another element; and wherein
electromotive force produced in said thermoelectric converting element by absorbing said heat is provided to said power supply portion to be used for driving said another element.

* * * * *